(12) United States Patent
Stutzman et al.

(10) Patent No.: US 9,357,670 B2
(45) Date of Patent: May 31, 2016

(54) EFFICIENT HEAT TRANSFER FROM CONDUCTION-COOLED CIRCUIT CARDS

(71) Applicant: Lockheed Martin Corporation, Bethesda, MD (US)

(72) Inventors: Randall J. Stutzman, Vestal, NY (US); Charles H. Dando, III, Endicott, NY (US); Clint Long, Montrose, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 230 days.

(21) Appl. No.: 14/182,803

(22) Filed: Feb. 18, 2014

(65) Prior Publication Data
US 2015/0237763 A1 Aug. 20, 2015

(51) Int. Cl.
*H05K 7/20* (2006.01)
*B23K 20/08* (2006.01)
*B23K 20/00* (2006.01)

(52) U.S. Cl.
CPC .............. *H05K 7/20* (2013.01); *B23K 20/002* (2013.01); *B23K 20/08* (2013.01); *H05K 7/2039* (2013.01)

(58) Field of Classification Search
CPC ........................................................ H05K 7/20
USPC .......................................................... 361/688
See application file for complete search history.

(56) References Cited

U.S. PATENT DOCUMENTS

| | | |
|---|---|---|
| 3,137,937 A | 6/1964 | Cowan et al. |
| 3,648,113 A | 3/1972 | Rathjen et al. |

(Continued)

FOREIGN PATENT DOCUMENTS

WO      00/41449 A1      7/2000

OTHER PUBLICATIONS

International Search Report and Written Opinion for PCT/US2015/015769 mailed May 15, 2015.

*Primary Examiner* — David Warren
(74) *Attorney, Agent, or Firm* — Wolf, Greenfield & Sacks, P.C.

(57) ABSTRACT

A conduction-cooled card assembly is disclosed that includes a conduction-cooling frame, a printed wiring board mounted on the frame, and a wedgelock fastener. The conduction-cooling frame has a thermal management interface adapted to transfer heat from the frame to a chassis, and the wedgelock fastener is adapted to press the thermal management interface of the conduction-cooling frame against a rail of the chassis. The assembly also has one or more of the following characteristics: (a) the thermal management interface of the conduction-cooling frame is made primarily of a first material and a portion of the thermal management interface that is adapted to engage the wedgelock fastener or the rail of the chassis is made of a second material that is softer than the first material, and (b) the wedgelock fastener is made primarily of a first material and a portion of the wedgelock fastener that is adapted to engage the thermal management interface or another rail of the chassis is made of a second material that is softer than the first material. A chassis for conduction-cooled card assemblies is also disclosed which comprises a housing and at least first and second rails within the housing that are adapted to receive a conduction-cooled card assembly therebetween. At least one of the first and second rails is made primarily of a first material and has a surface portion made of a second material that is softer than the first material.

20 Claims, 4 Drawing Sheets

(56) References Cited

U.S. PATENT DOCUMENTS

| | | | | |
|---|---|---|---|---|
| 4,605,986 A | * | 8/1986 | Bentz | H05K 7/20509 257/719 |
| 4,724,514 A | * | 2/1988 | Kaufman | H05K 1/0203 165/185 |
| 4,979,074 A | * | 12/1990 | Morley | H05K 3/0061 165/185 |
| 5,060,114 A | * | 10/1991 | Feinberg | H01L 23/433 165/185 |
| 5,432,679 A | * | 7/1995 | Grabbe | H01L 23/4006 257/E23.084 |
| 5,812,374 A | * | 9/1998 | Shuff | H05K 7/20545 165/185 |
| 5,859,764 A | * | 1/1999 | Davis | H05K 7/20545 165/80.3 |
| 5,949,650 A | * | 9/1999 | Bulante | H05K 1/056 165/185 |
| 6,246,582 B1 | | 6/2001 | Habing et al. | |
| 6,317,334 B1 | * | 11/2001 | Abruzzini | G11B 33/126 361/679.33 |
| 6,563,710 B1 | * | 5/2003 | Okuda | H05K 7/20918 361/600 |
| 6,621,706 B2 | | 9/2003 | Tzlil et al. | |
| 6,678,159 B1 | * | 1/2004 | Barcley | H05K 7/20545 165/185 |
| 6,839,235 B2 | | 1/2005 | St. Louis et al. | |
| 7,349,221 B2 | | 3/2008 | Yurko | |
| 8,081,478 B1 | | 12/2011 | Drexler et al. | |
| 8,477,498 B2 | | 7/2013 | Porreca et al. | |
| 2001/0033476 A1 | * | 10/2001 | Dibene | G06F 1/18 361/702 |
| 2003/0227750 A1 | * | 12/2003 | Glovatsky | H05K 7/2049 361/699 |
| 2005/0047068 A1 | * | 3/2005 | Kim | G06F 1/1601 361/679.27 |
| 2005/0128715 A1 | * | 6/2005 | Betman | H01L 23/4338 361/719 |
| 2006/0012034 A1 | * | 1/2006 | Kadoya | H05K 1/0203 257/712 |
| 2006/0077776 A1 | * | 4/2006 | Matsushima | G11B 33/128 369/30.27 |
| 2006/0176672 A1 | * | 8/2006 | Kamemoto | H05K 7/2049 361/714 |
| 2007/0047209 A1 | * | 3/2007 | Thompson | H01L 23/433 361/710 |
| 2007/0223208 A1 | * | 9/2007 | Tanaka | H05K 7/20418 361/807 |
| 2008/0094802 A1 | * | 4/2008 | Kumagai | G06F 1/203 361/709 |
| 2008/0278914 A1 | * | 11/2008 | Chen | G06K 7/0047 361/709 |
| 2009/0033221 A1 | * | 2/2009 | Lee | H05K 7/20963 313/582 |
| 2009/0046438 A1 | * | 2/2009 | Maeda | H05K 7/20509 361/756 |
| 2009/0135095 A1 | * | 5/2009 | Kawada | H05K 7/20963 345/60 |
| 2009/0135564 A1 | * | 5/2009 | Chen | H05K 7/20472 361/709 |
| 2009/0141450 A1 | * | 6/2009 | Sakata | H05K 7/2099 361/697 |
| 2009/0147472 A1 | | 6/2009 | Mantych et al. | |
| 2009/0166021 A1 | | 7/2009 | Slaton et al. | |
| 2009/0201649 A1 | * | 8/2009 | Jerg | H05K 7/20927 361/707 |
| 2009/0213550 A1 | * | 8/2009 | Hongo | H05K 7/20509 361/704 |
| 2009/0251865 A1 | * | 10/2009 | Tamori | H05K 7/2049 361/707 |
| 2009/0296345 A1 | | 12/2009 | Nguyen et al. | |
| 2010/0065256 A1 | * | 3/2010 | Wilcoxon | F28D 15/00 165/104.31 |
| 2010/0097767 A1 | * | 4/2010 | Jude | H05K 7/20409 361/709 |
| 2010/0290186 A1 | | 11/2010 | Zeng et al. | |
| 2011/0216506 A1 | * | 9/2011 | Liang | H05K 7/20 361/704 |
| 2012/0140418 A1 | * | 6/2012 | Taka | H05K 7/20154 361/710 |
| 2012/0300402 A1 | | 11/2012 | Vos | |
| 2012/0323352 A1 | * | 12/2012 | Groth | H05K 7/1434 700/98 |
| 2013/0170136 A1 | * | 7/2013 | Roby | H05K 7/205 361/692 |
| 2013/0265724 A1 | * | 10/2013 | Kaneko | H01L 21/50 361/715 |
| 2013/0342999 A1 | * | 12/2013 | Zhou | H05K 7/20509 361/715 |
| 2014/0024465 A1 | * | 1/2014 | Bodenweber | H05K 7/20127 463/46 |
| 2014/0170898 A1 | * | 6/2014 | Elison | H05K 7/20409 439/487 |
| 2014/0182924 A1 | * | 7/2014 | Misra | H05K 7/20454 174/377 |
| 2014/0248081 A1 | * | 9/2014 | Too | F28F 9/26 403/374.1 |
| 2014/0321065 A1 | * | 10/2014 | Nishimura | H05K 1/0203 361/722 |
| 2015/0009624 A1 | * | 1/2015 | Dunwoody | F28F 9/007 361/688 |
| 2015/0029658 A1 | * | 1/2015 | Yairi | G06F 1/20 361/679.47 |
| 2015/0055302 A1 | * | 2/2015 | Nagatomo | H01L 23/3735 361/709 |
| 2015/0168087 A1 | * | 6/2015 | Kim | F28F 21/08 361/720 |
| 2015/0230363 A1 | * | 8/2015 | Dernier | H05K 1/021 174/548 |
| 2015/0230365 A1 | * | 8/2015 | Kaplun | B23P 15/26 361/689 |
| 2015/0230366 A1 | * | 8/2015 | Shedd | H05K 7/20818 165/84 |
| 2015/0237763 A1 | * | 8/2015 | Stutzman | H05K 7/2039 361/708 |
| 2015/0255418 A1 | * | 9/2015 | Gowda | H01L 23/367 257/690 |
| 2015/0257303 A1 | * | 9/2015 | Shedd | F25B 41/00 62/62 |
| 2015/0271949 A1 | * | 9/2015 | Kim | H05K 7/20272 361/699 |
| 2015/0289410 A1 | * | 10/2015 | Salat | H01L 23/473 361/699 |
| 2015/0289413 A1 | * | 10/2015 | Rush | H05K 7/20336 361/700 |
| 2015/0296638 A1 | * | 10/2015 | Wu | H05K 5/02 174/548 |
| 2015/0296654 A1 | * | 10/2015 | Lin | H05K 7/2039 361/709 |
| 2015/0305189 A1 | * | 10/2015 | Strader | H05K 7/205 361/707 |

* cited by examiner

EFFICIENT HEAT TRANSFER FROM CONDUCTION-COOLED CIRCUIT CARDS

FIELD

This disclosure relates generally to cooling of circuit cards, and more particularly, to novel apparatuses and techniques for improving the efficiency of heat transfer from conduction-cooled circuit cards.

BACKGROUND

Proper thermal management is critical to the successful operation of many types of devices. Standard industry practice for cooling ruggedized avionics modules, for example, involves use of a conduction-cooling frame that is bonded to a printed circuit board to conduct heat out to an external chassis via a standard interface.

Such a technique is illustrated in FIG. 1. In the example shown, a conduction-cooled card assembly 100 includes a conduction-cooling frame 102 with a host printed wiring board 104 mounted on it via standoffs 106. Various components 108 are disposed on the host board 104, and a thermal fill material 110 is disposed between the components 108 and the frame 102 so as to allow heat to be conducted from the components 108 to the frame 102. A PCI Mezzanine Card (PMC) 112 is electrically interfaced with the host board 104 via a PMC connector 114. Heat from components 116 on the PMC 112 is conducted to the frame 102 via thermal pads 118 and a thermal rail 120. Wedgelock fasteners 122 are attached to thermal management interfaces 124 on either side of the frame 102. When the card assembly 100 is inserted between rails 126 of a chassis 128, tightening of the wedgelock fastener 122 causes the width of the fastener 122 to increase so that a top surface 130 of the wedgelock fastener 122 is pressed firmly against one of the rails 126a and a bottom surface 132 of the thermal management interface 124 is pressed firmly against another of the rails 126b, thereby securing the assembly in place within the chassis and creating a thermal interface between the frame 102 and the chassis 128. Heat from the frame 102 may thus be conducted from the frame 102 to the chassis 128 and may be dissipated from the chassis 128 via fluid flowing through a cooling wall 134 or by some other known mechanism.

SUMMARY

The foregoing is a non-limiting summary of the invention, some embodiments of which are defined by the attached claims.

In some embodiments, a conduction-cooled card assembly comprises a conduction-cooling frame, a printed wiring board mounted on the frame, and a wedgelock fastener. The conduction-cooling frame has a thermal management interface adapted to transfer heat from the frame to a chassis, and the wedgelock fastener is adapted to press the thermal management interface of the conduction-cooling frame against a rail of the chassis. The assembly also has one or more of the following characteristics: (a) the thermal management interface of the conduction-cooling frame is made primarily of a first material and a portion of the thermal management interface that is adapted to engage the wedgelock fastener or the rail of the chassis is made of a second material that is softer than the first material, and (b) the wedgelock fastener is made primarily of a first material and a portion of the wedgelock fastener that is adapted to engage the thermal management interface or another rail of the chassis is made of a second material that is softer than the first material.

In some embodiments, a method for forming a conduction-cooled card assembly having a conduction-cooling frame having a thermal management interface comprises one or more of the following acts: (a) bonding a second material to a portion of the thermal management interface of the conduction-cooling frame that is made primarily of a first material and is adapted to engage a rail of a chassis in which the assembly is to be installed or a wedgelock fastener, wherein the second material is softer than the first material; (b) bonding a second material to a portion of a wedgelock fastener that is made primarily of the first material and is adapted to engage the thermal management interface or a rail of the chassis in which the assembly is to be installed, wherein the second material is softer than the first material.

In some embodiments, a chassis for conduction-cooled card assemblies comprises a housing and at least first and second rails within the housing that are adapted to receive a conduction-cooled card assembly therebetween. At least one of the first and second rails is made primarily of a first material and has a surface portion made of a second material that is softer than the first material.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
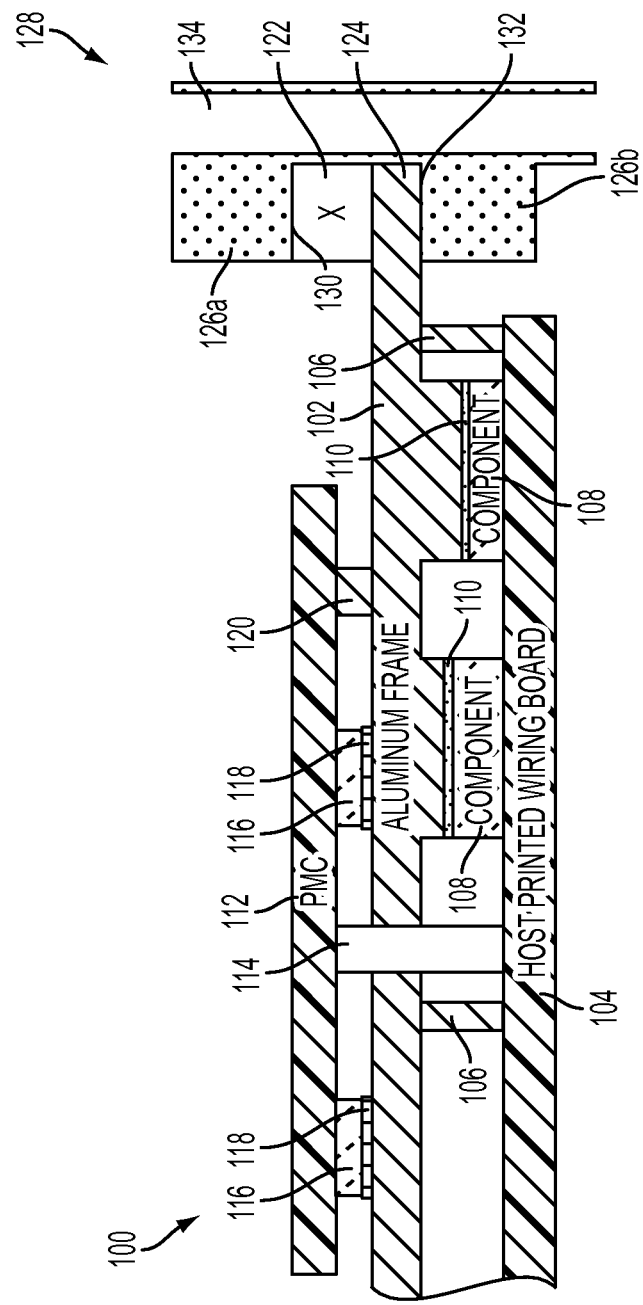
FIG. 1 illustrates a conventional wedgelock mounting technique for a conduction-cooled card assembly.

In a conventional implementation such as that described above in connection with FIG. 1, heat is transferred from the frame 102 to the chassis 128 by way of metal-to-metal contact at a junction between the thermal management interface 124 and the chassis 128, at a junction between the thermal management interface 124 and the wedgelock fastener 122, and at a junction between the wedgelock fastener 122 and the chassis 128, all of which are typically made of aluminum. The thermal resistance associated with conventional wedgelock interfaces is typically in the range of 0.15 to 0.45° C./W, with variations depending on manufacturer, installation torque, altitude, and other variables. Conventional wedgelock interface techniques thus limit the types and quantities of heat-generating components that can be utilized on circuit board assemblies, because the maximum heat that can be dissipated from such assemblies is limited by the heat transfer capability of the wedgelock interface.

The inventors have recognized that surface imperfections in the mated aluminum surfaces described above can impede the transfer of heat from the frame 102 to the chassis 128. The inventors have further appreciated that the heat transfer efficiency across the above-described metal-to-metal junctions may be improved by introducing a secondary material at one or more of the junctions so as to improve the thermal transfer efficiency across such junction(s). In some embodiments, for example, a metal or alloy having a softer modulus and/or higher thermal conductivity than aluminum may be introduced at one or more of the junctions. In some embodiments, the metal or alloy employed may have a Young's modulus less than 10,000,000 pounds per square inch (psi). Additionally or alternatively, the metal or alloy employed may have a thermal conductivity greater than 100 Watts per meter Kelvin (W/m-K). Suitable materials for such applications may, for example, include gold, copper, and indium. For some applications, in may be desirable to additionally or alternatively introduce one or more other metals at one or more of the junctions to improve corrosion resistance or to address other concerns. The chart of FIG. 5 identifies twenty eight different metals that may be introduced at one or more of the metal-to-metal junctions in various embodiments.

Figure 5:
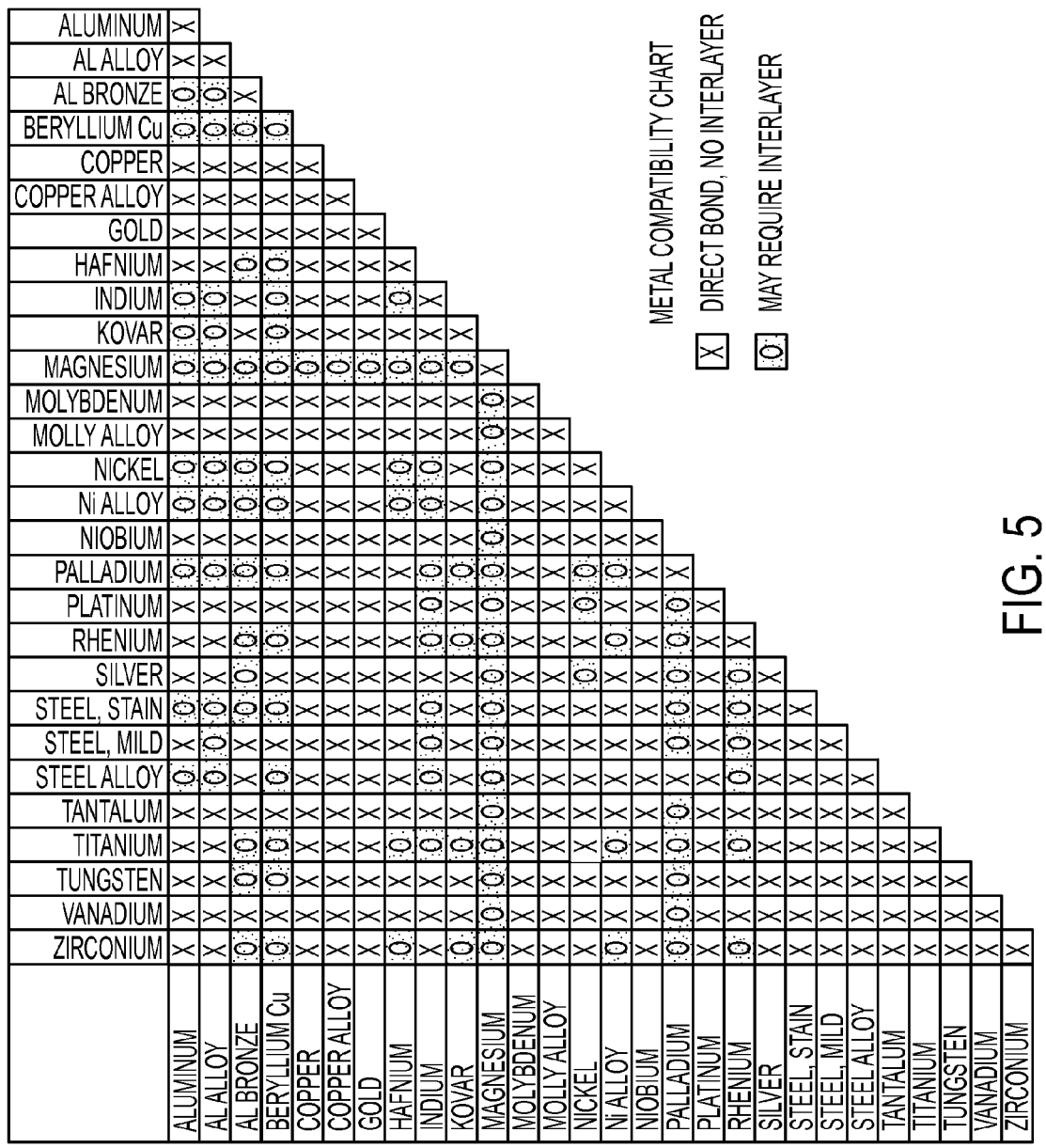
FIG. 5 is a chart showing examples of metals that may be explosion-bonded with one another, either with or without the use of an interlayer, in accordance with various embodiments described herein.

In some embodiments, a bi-metallic surface layer may be created on one or both sides of the thermal management interface 124 of the frame 102, on one or more surfaces of the wedgelock 122, and/or on one or both of the rails 126*a*-*b* of the chassis 128, by introducing aluminum members to an explosive bonding process that adds a material having a soft modulus and high-thermal conductivity, such as gold, to one or more surfaces at the junction points between the frame 102, the wedgelock 122, and the chassis 128. Examples of twenty six other materials, in addition to gold, that may be additionally or alternatively explosion bonded to aluminum components in various applications are shown in FIG. 5. In the chart of FIG. 5, an "X" in the box corresponding to a pair of materials indicates that those materials may be directly bonded to one other via an explosive bonding process, and a "O" in the box indicates that an interlayer may be required between the materials for explosive bonding to be employed.

It should be appreciated that, for some applications, one or more of the thermal management interfaces 124, the wedgelock 122, and/or the rails 126 may be made of a material other than aluminum, e.g., one of the other twenty seven materials identified in FIG. 5. In such implementations, any of the other materials identified in FIG. 5 may be explosion bonded to such alternative material, either with or without an interlayer (as indicated), so as to create a bi-metallic surface that can improve heat transfer efficiency and/or corrosion resistance, or for some other purpose.

Explosive bonding is a solid state welding process, which uses a controlled explosive detonation to force two metals together at high pressure. Typical impact pressures are millions of psi. The resultant composite system is joined with a durable, metallurgical bond. When an explosion boding process is employed, the metals do not commingle; they are atomically bonded.

The introduction of such a secondary material using such a process causes the secondary material to conform to the surface irregularities of the aluminum components and allows intimate physical contact to occur between the contacting members, resulting in a better heat path and lower temperature.

Test data suggests a non-linear behavior exists between the thermal conductivity, modulus of elasticity, and hardness of a material with respect to the corresponding thermal interface resistance. The use of an explosive bonding process allows for the adhesion of one metal (e.g., gold) to another metal (e.g., aluminum) at the molecular level, thus eliminating any thermal interface resistance between the two metals. Introduction of such a bi-metallic layer has the ability to generate a 5-fold improvement in thermal conductivity.

Figure 2:
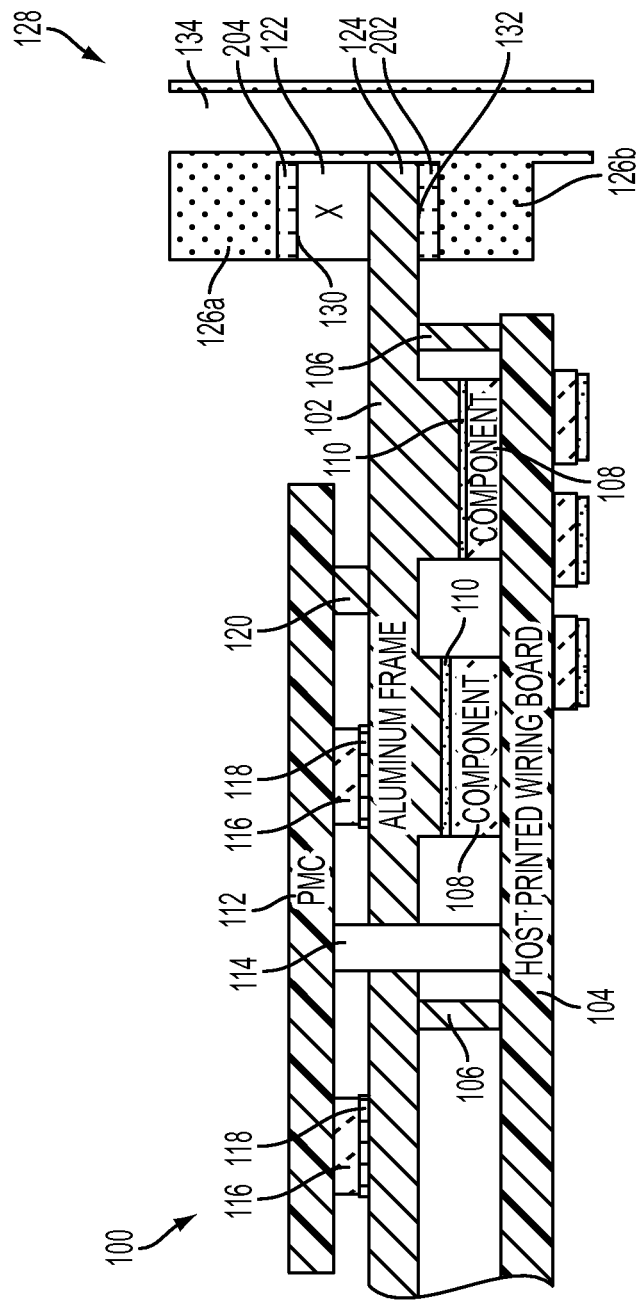
FIG. 2 illustrates an example embodiment of a conduction-cooled card assembly employing bi-metallic thermal interfaces.
Figure 3:
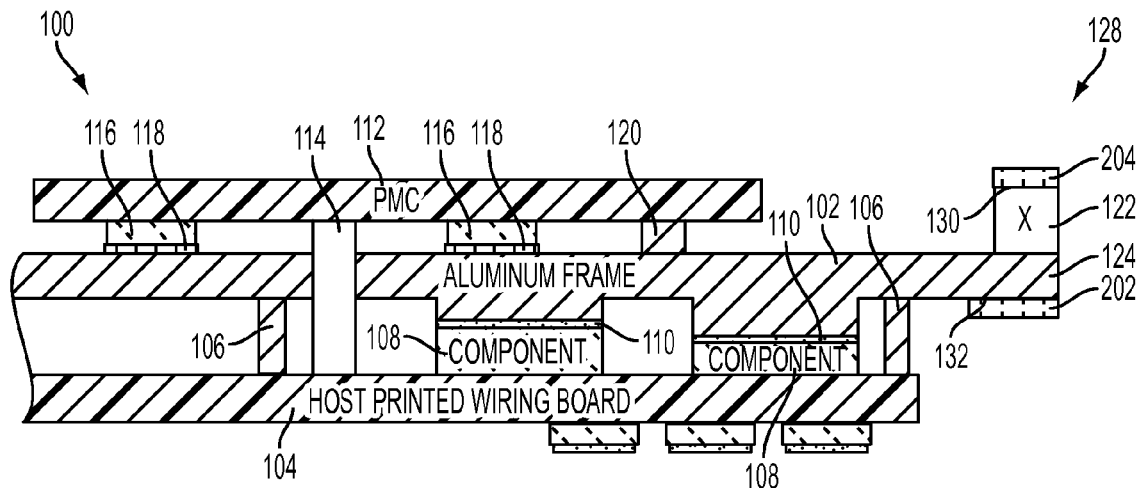
FIG. 3 illustrates an embodiment in which bi-metallic thermal interfaces are formed on a thermal management interface of a conduction-cooled frame and a surface of a wedgelock fastener.
Figure 4:
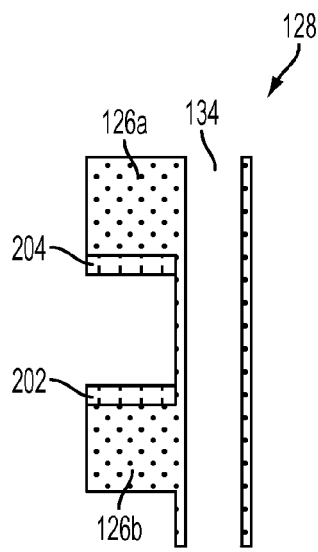
FIG. 4 illustrates an embodiment in which bi-metallic thermal interfaces are formed on the rails of a chassis.

FIG. 2 shows an example embodiment in which a first bi-metallic layer 202 has been introduced between the rail 126*b* and the bottom surface 132 of the thermal management interface 124, and a second bi-metallic layer 204 has been introduced between the rail 126*a* and the top surface 130 of the wedgelock fastener 122. As shown in FIGS. 3 and 4, the layers 202, 204 may, for example, be formed on either or both of the wedgelock 122 and the thermal management interface 124 (see FIG. 3), and may additionally or alternatively be formed on one or both of the mating surfaces of the rails 126 (see FIG. 4). Although not illustrated, a bi-metallic layer may additionally or alternatively be formed between the wedgelock fastener 122 and the thermal management interface 124, e.g., by using an explosive bonding process to bond a suitable metal (e.g., gold) to a mating surface of the wedgelock fastener 122 and/or the thermal management interface 124.

In the illustrated embodiments, heat generated within the components 108, 116 travels from the components to the frame 102 by conduction. The heat is then transported by the frame 102 to the thermal management interface 124 of the frame 102, which is held in place against the rail 126*b* by a wedgelock fastener 122. When one or more of the contact areas, e.g., between the rail 126*b* and the thermal management interface 124 of the aluminum frame 102, is coated with gold or another suitable material, an intimate thermal connection may be formed that provides an improved thermal path to transport the heat to the rail 126 and cooling wall 134.

In other embodiments, one or more of the bi-metallic surface layer(s) may be formed by plating one material on another, or by some other suitable process.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

Various aspects of the present invention may be used alone, in combination, or in a variety of arrangements not specifically discussed in the embodiments described in the foregoing and is therefore not limited in this application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc. in the claims to modify a claim element does not by itself connote any priority, precedence or order of one claim element over another or the temporal order in which acts of a method are performed, but are used merely as labels to distinguish one claimed element having a certain name from another element having a same name (but for use of the ordinal term) to distinguish the claim elements.

Also, the phraseology and terminology used herein is used for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A conduction-cooled card assembly, comprising:
   a conduction-cooling frame having a thermal management interface adapted to transfer heat from the frame to a chassis;
   a printed wiring board mounted on the conduction-cooling frame; and
   a wedgelock fastener adapted to press the thermal management interface of the conduction-cooling frame against a rail of the chassis;
   wherein:
   the thermal management interface of the conduction-cooling frame is made primarily of a first material, a portion of the thermal management interface that is adapted to engage the wedgelock fastener or the rail of the chassis is made of a second material that is softer than the first material, and the second material is atomically bonded to the first material; or
   the wedgelock fastener is made primarily of a first material, a portion of the wedgelock fastener that is adapted to engage the thermal management interface or another rail of the chassis is made of a second material that is softer than the first material, and the second material is atomically bonded to the first material.

2. The conduction-cooled card assembly of claim 1, wherein the thermal management interface of the conduction-cooling frame is made primarily of the first material, the portion of the thermal management interface that is adapted to engage the wedgelock fastener or the rail of the chassis is made of the second material that is softer than the first material, and the second material is atomically bonded to the first material.

3. The conduction-cooled card assembly of claim 2, wherein the second material of the thermal management interface is selected from the group consisting of gold, copper, and indium.

4. The conduction-cooled card assembly of claim 3, wherein the second material of the thermal management interface is explosion bonded to the first material of the thermal management interface.

5. The conduction-cooled card assembly of claim 2, wherein the second material of the thermal management interface is explosion bonded to the first material of the thermal management interface.

6. The conduction-cooled card assembly of claim 1, wherein the wedgelock fastener is made primarily of the first material, the portion of the wedgelock fastener that is adapted to engage the thermal management interface or another rail of the chassis is made of the second material that is softer than the first material, and the second material is atomically bonded to the first material.

7. The conduction-cooled card assembly of claim 6, wherein the second material of the wedgelock fastener is selected from the group consisting of gold, copper, and indium.

8. The conduction-cooled card assembly of claim 7, wherein the second material of the wedgelock fastener is explosion bonded to the first material of the wedgelock fastener.

9. The conduction-cooled card assembly of claim 6, wherein the second material of the wedgelock fastener is explosion bonded to the first material of the wedgelock fastener.

10. A method for forming a conduction-cooled card assembly having a conduction-cooling frame having a thermal management interface, comprising:
    atomically bonding a second material to a portion of the thermal management interface of the conduction-cooling frame that is made primarily of a first material and is adapted to engage a rail of a chassis in which the assembly is to be installed or a wedgelock fastener, wherein the second material is softer than the first material; or
    atomically bonding a second material to a portion of a wedgelock fastener that is made primarily of the first material and is adapted to engage the thermal management interface or a rail of the chassis in which the assembly is to be installed, wherein the second material is softer than the first material.

11. The method of claim 10, comprising the act of atomically bonding the second material to the portion of the thermal management interface of the conduction-cooling frame that is made primarily of the first material and is adapted to engage the rail of the chassis in which the assembly is to be installed or the wedgelock fastener, wherein the second material is softer than the first material.

12. The method of claim 11, wherein the second material that is atomically bonded to the portion of the thermal management interface is selected from the group consisting of gold, copper, and indium.

13. The method of claim 12, wherein the act of atomically bonding is performed using an explosion bonding technique.

14. The method of claim 11, wherein the act of atomically bonding is performed using an explosion bonding technique.

15. The method of claim 10, comprising the act of atomically bonding the second material to the portion of the wedgelock fastener that is made primarily of the first material and is adapted to engage the thermal management interface or the rail of the chassis in which the assembly is to be installed, wherein the second material is softer than the first material.

16. The method of claim 15, wherein the second material that is atomically bonded to the portion of the wedgelock fastener is selected from the group consisting of gold, copper, and indium.

17. The method of claim 15, wherein the act of atomically bonding is performed using an explosion bonding technique.

18. A chassis for conduction-cooled card assemblies, comprising:
    a housing; and
    at least first and second rails within the housing that are adapted to receive a conduction-cooled card assembly therebetween, wherein at least one of the first and second rails is made primarily of a first material and has a surface portion made of a second material that is softer than the first material, and wherein the second material is atomically bonded to the first material.

19. The chassis of claim 18, wherein the second material is selected from the group consisting of gold, copper, and indium.

20. The chassis of claim 18, wherein the second material is explosion bonded to the first material.

* * * * *